United States Patent [19]

Eranian et al.

[11] 4,259,162
[45] Mar. 31, 1981

[54] FAMILY OF COMPOUNDS CROSSLINKABLE BY PHOTON IRRADIATION

[75] Inventors: Armand Eranian; Jean-Claude Dubois; Maryse Gazard; Françoise Barre, all of Paris, France

[73] Assignee: Thomson-CSF, Paris, France

[21] Appl. No.: 882,169

[22] Filed: Feb. 28, 1978

[30] Foreign Application Priority Data

Mar. 4, 1977 [FR] France .............................. 77 06441

[51] Int. Cl.$^3$ ......................... C08F 8/00; C08F 8/34; C08J 3/24
[52] U.S. Cl. ...................... 204/159.16; 204/159.18; 204/159.24; 525/329; 525/337; 525/340; 525/360; 525/370; 526/256
[58] Field of Search ................... 526/256; 204/159.24, 204/159.18, 159.16; 525/337, 340, 360, 370; 427/58, 122

[56] References Cited

U.S. PATENT DOCUMENTS

| | | | |
|---|---|---|---|
| 3,364,184 | 1/1968 | Krukiener et al. | 260/79.5 R |
| 3,404,158 | 10/1968 | Yu | 526/256 |
| 3,708,296 | 1/1973 | Schlesinger | 204/159.18 |
| 3,997,344 | 12/1976 | Schlesinger et al. | 204/159.18 |
| 4,091,194 | 5/1978 | Schlesinger | 204/159.18 |
| 4,130,424 | 12/1978 | Feit et al. | 204/159.13 |

FOREIGN PATENT DOCUMENTS

| | | | |
|---|---|---|---|
| 2722951 | 5/1977 | Fed. Rep. of Germany | 526/256 |
| 1534152 | 7/1968 | France . | |
| 1574534 | 7/1969 | France . | |

OTHER PUBLICATIONS

Journal of Pol. Science, Part A, vol. 3, Jul. 1965, p. 2701.

*Primary Examiner*—William F. Hamrock
*Attorney, Agent, or Firm*—Cushman, Darby & Cushman

[57] ABSTRACT

A family of negative resins, capable of undergoing crosslinking under the effect of more or less energetic photons (gamma radiation, X-rays, ultraviolet or visible light), applicable to the protection of objects against atmospheric agents and to the production of masks of the type used in the production of integrated circuits. The typical compound according to the invention contains at least one substance of which the chemical formula comprises a thiirane ring:

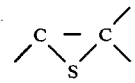

such as 2,3-epithiopropyl methacrylate copolymerized with a vinyl monomer, such as methyl methacrylate. Crosslinking is facilitated by photoinitiators, such as aryl diazonium and aryl iodonium salts liberating Lewis acids. By selecting the photoinitiator, it is possible to act on the spectral region where irradiation is effective.

4 Claims, No Drawings

FAMILY OF COMPOUNDS CROSSLINKABLE BY PHOTON IRRADIATION

This invention relates to a family of compounds which can be crosslinked by photon irradiation and to a process for using these compounds. The photons used for irradiation are photons issuing from either visible or invisible radiation, particularly ultraviolet radiation, X-radiation or gamma radiation.

The phenomenon of crosslinking of so-called negative resins is well known. Resins such as these harden under the effect of photon irradiation by the establishment of "bridging" bonds between the various polymer chains which they contain. These bonds result in the formation of a three-dimensional network. From the point of view of the intrinsic properties of the resins, this is reflected in an increase in their molecular weight which is responsible for their insolubility in developer solvents.

Commercially available crosslinkable resins are formed:
either by a polymer containing both a crosslinkable group and a photosensitive group:
or by a "system" containing both a polymer having a crosslinkable entity and a photoinitiator or photosensitiser compound.

The sensitivity of two known crosslinkable compositions is given in the following by way of order of magnitude:

4 mJ/cm² (in photon irradiation at a wavelength of 404.7 nm) for the resin KPR (a Kodak product);

1.3 mJ/cm² (in photon irradiation at wavelengths of 351.1 and 363.8 nm) for the epoxy resin commercially available under the name "PSE-2"; a sensitivity of this order requires an exposure time of around 10 seconds under normal wording conditions in a factory.

By virtue of the present invention, it is possible to obtain excellent sensitivity levels, i.e. in favourable cases of the order of one tenth of a millijoule per square centimeter.

In addition, the compounds according to the invention have other advantages which will be discussed hereinafter.

According to the invention, there is provided a family of compounds crosslinkable by photon irradiation comprising at least one copolymer of which the chemical formula comprises a thiirane ring:

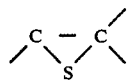

wherein said polymer contains at least one monomer formed by 2,3-epithiopropyl methacrylate corresponding to the developed formula:

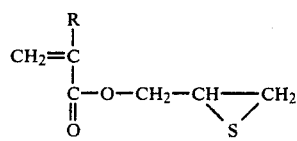

wherein R is selected from the group consisting of an alkyl group of 1 to 4 carbon atoms and hydrogen.

According to one aspect of the invention, the above monomer is copolymerized with a vinyl monomer corresponding to the formula:

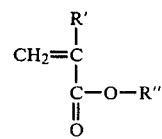

in which R' is either a radical H or an alkyl group $C_nH_{2n+1}$ where n is an integer from 1 to 10, R" being an alkyl group containing from 1 to 5 carbon atoms.

According to another aspect of the invention, said family additionally comprises at least one of the following two salts:

an aryl diazonium salt corresponding to the general formula:

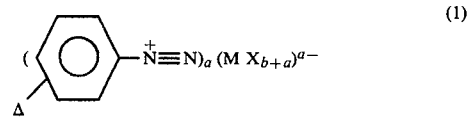

and an aryl iodonium salt corresponding to the formula:

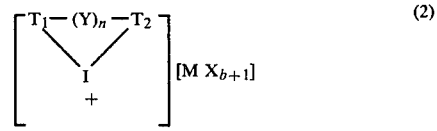

where n=0 or 1.

In these formulae:
the substituent Δ denotes a radical or a plurality of radicals such as:—OH;—NH₂;—CHO;—NO₂; —OCH₃;

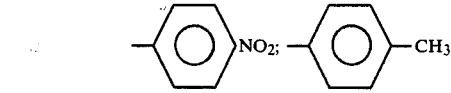

the letters a and b denote integers from 1 to 5;
the element M is a metal such as Fe, Sn, Sb or Bi or another element such as B, P, As;
X denotes a halogen atom, such as F or Cl;
T₁ and T₂ denote aromatic radicals (which may be identical) containing from 4 to 20 carbon atoms (phenyl, thienyl, furanyl, pyrazolyl);
Y denotes a radical of the following group:

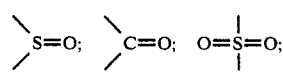

R₃—N (with R₃=H or an alkyl or acyl radical or a C—C bond);

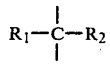

(where $R_1$ and $R_2$ represent identical or different radicals such as H or a $C_{1-4}$-alkyl radical or a $C_{2-4}$-alkenyl radical).

The copolymer of 2,3-epithiopropyl methacrylate and the vinyl monomer may be obtained as follows:

Glycidyl methacrylate corresponding to the formula:

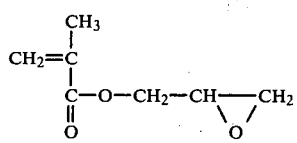

is reacted with thiourea corresponding to the formula:

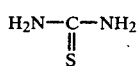

at ambient temperature in a mixture of water and ethanol. The reaction gives 2,3-epithiopropyl methacrylate corresponding to the formula:

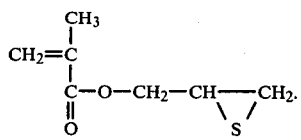

This compound is extracted with ether. The solution is dried with sodium sulphate. The ether is removed in vacuo and the remaining product is distilled in vacuo.

The epithiopropyl methacrylate thus obtained is mixed with a quantity of vinyl monomer in a proportion of from 20 to 60% by weight thereof in a solvent, such as benzene. Azo-bis-isobutyronitrile, which acts as copolymerisation catalyst, is then added to the resulting mixture. The mixture is heated under nitrogen at 80° C. over a period ranging from one to several hours. After cooling, the copolymer is obtained by precipitation with methanol, followed by drying in vacuo.

For example, the vinyl monomer may be butyl methacrylate or ethylacrylate.

The invention will be better understood from the following description and examples which in particular define a process for using the resin.

In the formula of the diazonium salt, the ion:

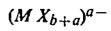

is a complex halogenated anion (X=F or Cl) with a metallic or non-metallic element M (such as defined above) of which th charge is a. The number of negative charges also represents the number of halogenated ions complexed with the Lewis acid $M X_b$.

A similar situation with a single negative charge on the halogenated anion prevails in the case of the diaryl iodonium salt.

By photolysing, these salts produce the Lewis acids $M X_b$ which chemically initiate the crosslinking process by a cationic mechanism. This mechanism consists in the formation of a covalent bond between the sulphur atom of the thiirane cycles, which gives an electron pair, and the element M which accepts this electron pair.

The formation of a complex having an ionic tendency, which results from the more intensive polarisation of one of the C—S bonds of the thiirane rings, enables the opening of other thiirane rings to be initiated, giving rise to a cationic crosslinking reaction:

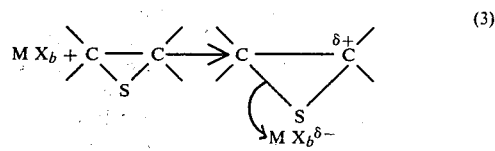

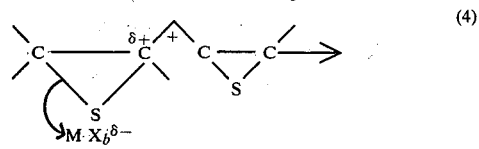

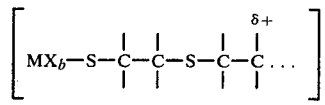

The phase (3) is the initiation phase; the phase (4) is the propagation phase.

Since the thiirane ring is not (or only slightly) affected by agents forming free radicals, but is highly sensitive to ion attacks, the radiation dose required for crosslinking the "thiirane" resins in the presence of Lewis acids is lower than when they are irradiated on their own.

The photocrosslinking of the compounds according to the invention is a reaction of the initiated type because, once the degradation of the photoinitiators (aryl diazonium or aryl iodonium salts) has been initiated, i.e. after formation of the Lewis acids, irradiation may be stopped and the crosslinking reaction may continue in the absence of irradiation like any polymerisation reaction initiated by Lewis acids.

Although the resins according to the invention used on their own can only be sensitised in a narrow spectral region, the addition of the above-mentioned photoinitiators not only enables sensitivity to be increased, it also enables the spectral sensitivity range to be widened by extending it in some cases into the range of visible light.

Thus, by acting on the substituent of the aryl group in the case of the aryl diazonium salts, the absorption range is displaced towards the visible. For example, with a substituent such as a halogen atom or an alkyl radical, a slight displacement is obtained towards the major wavelengths (up to 273 nm for the substituent Cl). This displacement becomes very considerable when groups containing non-binding electrons, such as —OH; —NH$_2$; —CHO; —NO$_2$; —OCH$_3$

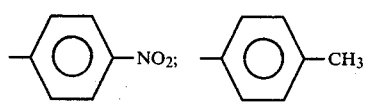

are substituted.

In order to obtain sensitisation in the region of visible light, it is necessary for example to add to the above-mentioned products so-called "photo-optical" products which serve to sensitise the photoinitiators (for example the aryl diazonium and aryl iodonium salts). In general, sensitisation is obtained by the transfer of energy from the "triplet" state of the sensiser (donor) to the "triplet" state of the initiator (acceptor), photodegradation taking place under the effect of this input of energy.

Depending upon the required spectral region of sensitisation, the "photo-optical" products may belong to various families of dyes, provided that these dyes do not destroy the Lewis acids formed during the initiation phase and that their energy levels are adapted to those of the photoinitiators used so as to provide for an effective transfer of energy.

The dyes in question include, for example, coumarins, xanthenes, acridines, thiopyronines, safranines, thiazines, oxazines, cyanines (carbocyanines, oxacyanines, thiacyanines), coloured polycyclic aromatic hydrocarbons and, finally, compounds containing para-substituted aminostyryl groups.

As mentioned above, the compounds according to the invention may be crosslinked by ionising radiation, such as X-radiation or gamma radiation. Their sensitivities to radiation of this type are approximately ten times higher than those of the corresponding epoxy resins, for example 80 J/cm$^3$ as opposed to 740 J/cm$^3$ for an irradiation wavelength of 8.34 Angstroms.

In the case of irradiation by soft X-rays (spectral region where the photo-electrical absorption is preponderant over the Compton diffusion), for example for photons with energy levels of from about 0.1 to 10 KeV, it is possible to increase the sensitivity of the compounds according to the invention to excess in relation to that of epoxy resins by increasing their coefficient of absorption to the X-rays by optimisation of the irradiation wavelength, as explained hereinafter.

It is known that the sensitivity of a resin to radiation depends upon the energy of the incident photons which it absorbs. Its so-called "X-photoelectric" absorption coefficient is a weighted sum of the absorption coefficients of the various atomic species by which it is formed. These coefficients increase with the incident wavelength (proportionally to the third power) and with the atomic number of the absorbent (proportionally to the fourth power) between the discontinuities which characterise the photoelectric absorption. These discontinuities which correspond to the ionisation potentials of the various energy levels are characteristic of each type of atom.

In order to increase the sensitivity of the compounds according to the invention to soft X-rays, the wavelength of the X-rays is selected for example in the spectral region situated beyond a discontinuity of oxygen and within one of the following discontinuities of sulphur.

This is the case between the wavelengths of 76.05 Angstroms (discontinuity $L_{II}$ of sulphur) and 23.30 Angstroms (discontinuity K of oxygen) where the absorption coefficient of sulphur is respectively from 7 to 20 times greater than that of oxygen, although these two coefficients have substantially the same value for shorter wavelengths, i.e. 23,000 cm$^{-1}$ at 22.3 Angstroms; the absorption coefficient of oxygen becoming greater than that of sulphur at longer wavelengths (i.e. respectively 55,700 and 24,900 cm$^{-1}$ at 109 Angstroms).

The following table gives the absorption coefficients of the oxygen and sulphur atoms for certain wavelengths (or photon energy levels) situated in the range favourable to an increase in sensitivity of the compounds according to the invention, the wavelengths selected being those of the lines of various atoms emitting in the region in question.

| λ(Å) | E(KeV) | Nature of the line emitted | $\mu_O$(cm$^{-1}$) | $\mu_S$(cm$^{-1}$) | $\mu_S/\mu_O$ |
|---|---|---|---|---|---|
| 23.6 | 0.525 | O - $K_\alpha$ | 1368 | 26931 | 19.7 |
| 27.4 | 0.452 | Ti - $L_{\alpha 1.2}$ | 2002 | 37943 | 18.95 |
| 31.4 | 0.395 | Ti - $L_l$ | 2825 | 50798 | 18.0 |
| 31.6 | 0.392 | N - $K_\alpha$ | 2881 | 51605 | 17.9 |
| 44.7 | 0.277 | C - $K_\alpha$ | 6890 | 99236 | 14.4 |
| 58.4 | 0.212 | W - $N_{V,II}$ | 13247 | 126601 | 9.6 |
| 64.4 | 0.193 | MO - $M_\zeta$ | 16587 | 144465 | 8.7 |
| 67.6 | 0.183 | B - $K_\alpha$ | 18844 | 153553 | 8.15 |
| 72.2 | 0.172 | Nb - $M_\zeta$ | 21842 | 165145 | 7.6 |

In the above-mentioned region, the use of photoinitiators such as the complex aryl diazonium and diaryl iodonium salts enables the sensitivity of the compounds containing a thiirane ring to be increased, the X or gamma photons initiating the degradation of these salts into Lewis acids in the same way.

In addition, in the region of the soft X-rays where the photoelectric absorption is preponderant, the choice of the photoinitiator, particularly the choice of the element M in the general formula of the complex salt, enables the sensitivity of the compound according to the invention to be increased, as shown hereinafter.

It is known that, in general, the interaction mechanism between radiation and sensitive resin uses a transfer of energy from the chemical group or the absorbent atom of the resin towards its sensitive part. The effectiveness of this transfer is dependent upon the distance between these two "entities".

Accordingly, it is possible to use to advantage the narrow distance between the absorbing group and the sensitive group in case where the above mentioned complex salts are used, i.e. the proximity between the sulphur atom of the thiirane ring and the element M of the Lewis acid. Accordingly, this element is selected according to its X-photon absorption coefficient.

The following table shows the absorption coefficients in cm$^{-1}$ for five elements M in five cases of use characterised by the emission of different atomic lines.

| Element | λ   8.34 Å line $K_{\alpha 1.2}$ of Al | 13.3 Å line $L_{\alpha 1.2}$ of Cu | 23.6 Å line $K_\alpha$ of O |
|---|---|---|---|
| Fe | 27071 | 84173 | 31504 |
| Sn | 24350 | 70344 | 168788 |
| Sb | 23522 | 63625 | 22870 |
| Bi | 26580 | 62137 | 123689 |
| As | 30942 | 14359 | 50453 |

| Element | λ   44.7 Å line $K_\alpha$ of C | 72.2 Å line $M_\zeta$ of Nb |
|---|---|---|
| Fe | 104724 | 221496 |
| Sn | 46287 | 47932 |
| Sb | 44167 | 44181 |
| Bi | 92918 | 32019 |
| As | 159867 | 268336 |

A PROCESS FOR USING THE COMPOUNDS AND EXAMPLES OF APPLICATION

The compounds according to the invention are referred to hereinafter by the name of "thiirane resin".

Two principal uses of the thiirane resins are described in the following.

The first use is in the production of masks "in situ" during the manufacture of electronic components, these masks being intended for electronic masking purposes. The technique in question is the technique of microlithography used in particular for the production of integrated circuits.

The second use is in the treatment of various objects with a view to coating them with a protective layer; this is the case with sheaths of electrical cables and articles of cabinet work.

In both cases, the first step is to prepare a solution of thiirane resines in a solvent, such as 2-butanone.

In the first case, the solution is applied to a substrate or to a wafer containing one or more integrated circuits in the course of formation using a centrifugal apparatus. A layer varying in thickness from 200 to 500 nanometers for example is obtained, depending upon the rotational speed of the substrate or wafer.

Irradiation is then carried out using a source of actinic (visible or ultraviolet) light, such as a deuterium lamp, a mercury vapour lamp, a xenon lamp, a carbon arc lamp, a tungsten filament lamp or a laser, such as a laser containing organic molecules (for example an organic scintillator or dye).

In the second case, the procedure adopted may be the same as in the first case or may comprise dip coating or spray coating. The layer is generally thicker where these last two techniques are used, which is preferably for obtaining effective protection.

In this latter case, irradiation must be carried out in depth, so that it is of advantage to use a penetrating radiation, such as soft X-rays. To this end, it is possible to use either a synchrotron or an apparatus comprising an electron gun and an anticathode selected according to the desired wavelength: rhodium (line at 4.6 Angstroms), molybdenum (line at 5.41 Angstroms), aluminium (line at 8.34 Angstroms), copper (line at 13.3. Angstroms), carbon (line at 44.7 Angstroms). Finally, it is possible to use the gamma rays produced by a conventional cesium- or cobalt-based source.

FIRST EXAMPLE

This example concerns the photocrosslinking of a thiirane resin used on its own with a view to its application in microlithography.

1.5 g of a copolymer of 2,3-epithiopropyl methacrylate and methyl methacrylate (in a ratio of 1:1) are dissolved in 2-butanone to obtain a 10% solution.

A substrate of oxidised silicon (500 to 100 Angstroms of silica) is then coated by centrifuging with this resin.

The substrate thus treated is then subjected to the flux of a high pressure mercury vapour lamp, for example a 125 watt lamp of the HPR 125 type manufactured by Philips. The distance between the source and the sample is 12 cm. The flux received by the sample is 4.33 mW/cm$^2$ at 365 nm. The irradiation time is adjusted by trial and error to obtain 70% crosslinking of the thickness of the layer of resin.

Development is carried out by spraying on a mixture of 2-butanone and ethanol in a ratio of 5:1.8 for a period of 30 seconds, followed by the spraying of isopropanol over a substantially identical period.

SECOND EXAMPLE

This example is also concerned with applications in microlithography. On this occasion, however, the resin used is mixed with a photoinitiator which, under irradiation, releases Lewis acids which initiate the crosslinking process.

The photoinitiator used is a complex aryl diazonium salt, namely p-diazo-N, N-diethyl aniline hexafluoro antimonate, which has an absorption in ultraviolet light at 375 nm. This salt is obtained by precipitation from an aqueous solution of p-diazo-N,N-diethyl aniline fluoborate to which sodium hexafluoro antimonate is added.

An aqueous solution of freshly prepared Na Sb F$_6$ containing 3.14 g of this compound in 2.5 cc of twice-distilled water is added to 3.91 g of the above-mentioned fluoborate (i.e. $1.21 \times 10^{-2}$ mole) dissolved in 90 cc of twice-distilled water. The precipitate is collected by filtration and then dried in vacuo. The yield obtained amounts to 55.4%.

In the absence of any actinic radiation, 0.0375 g of the photoinitiator thus obtained are dissolved in a solution of thiirane resin similar to that of the first example. The quantity of photoinitiator used is calculated to obtain a proportion of 5% by weight, based on the weight of the resin.

A substrate of oxidised silicon coated with resin under the same conditions as in the first example, is irradiated in the same way, but for a different time, to obtain 70% crosslinking of the thickness of the layer of resin.

THIRD EXAMPLE

This example is similar to the first example, except that irradiation is carried out with soft X-rays.

2 g of copolymer of 2,3-epithiopropyl methacrylate and methyl methacrylate (in a ratio of 1:2) are dissolved in 22.3 cc of 2-butanone to form a solution containing 10% of solute. The deposition of this resin by centrifuging (at 8000 rpm) onto a substrate of oxidised silicon enables a layer of resin 5200 Angstroms thick to be obtained.

The X irradiation is obtained by the electron bombardment of an anticathode of aluminium with a 300 W gun (intensity 50 milliamperes for an accelerating voltage of 6 kV). The emission observed is that of the $K_{\alpha 1.2}$ line of aluminium, i.e. a wavelength of 8.34 Angstroms. The flux X after filtration through a 2 micrometer thick aluminium foil (intended to eliminate the lowest-energy component of the decelerating radiation) is evaluated at 398.5 microwatts per cm$^2$. The irradiation time is 1 minute 45 seconds corresponding to an absorbed dose of 80 J/cc for crosslinking 70% of the coated thickness after development by the same mixture as in the first example and under the same condition.

FOURTH EXAMPLE

This example is similar to the second example except that irradiation is carried out with soft X-rays.

A solution of thiirane resin (copolymer of 2,3-epithiopropyl methacrylate and methyl methacrylate) is prepared under the same conditions as in the third example. The photoinitiator of the second example is added to the solution in such a quantity that a proportion of 5%, based on the weight of the resin, is obtained.

The X-irradiation is carried out under the same conditions as in the third example. The irradiation time is adjusted by trial and error to obtain the 70% crosslinking of the thickness of the layer of resin.

What we claim is:

1. A copolymer composition crosslinkable by ultraviolet light rays into a 3-dimensional network, said composition comprising, as the crosslinkable monomers:

(i) from 40 to 80% by weight of 2,3 epithiopropyl alkyl acrylate monomer units of the formula

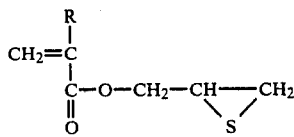

wherein R is hydrogen or a $C_1$ to $C_4$ alkyl; and
(ii) from 60 to 20% by weight of vinyl monomer units of the formula:

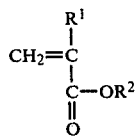

wherein $R^1$ is hydrogen or an alkyl group of the formula $C_nH_{2n+1}$, wherein n is an integer from 1 to 10 and $R^2$ is a $C_1$ to $C_5$ alkyl group, together with
(iii) an ultraviolet initiating amount of an aryl diazonium salt of the formula:

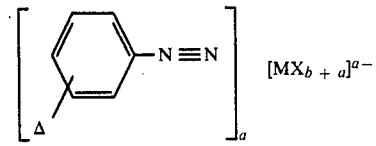

wherein a and b are integers from 1 to 5 and $\Delta$ is selected from the group consisting of —OH, —$NH_2$, —CHO, —$OCH_3$ —$NO_2$,

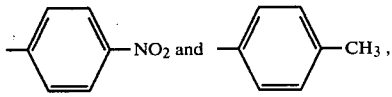

M is Fe, Sn, Sb, Bi, B, P or As, and X is halogen.

2. The family of compounds claimed in claim 1, wherein said vinyl monomer is ethyl methacrylate.

3. The family of compounds claimed in claim 1, wherein said vinyl monomer is butyl methylacrylate.

4. The family of compounds claimed in claim 1, wherein said vinyl monomer is ethylacrylate.

* * * * *